United States Patent
Hao et al.

(10) Patent No.: US 11,495,179 B2
(45) Date of Patent: Nov. 8, 2022

(54) ARRAY SUBSTRATE, DISPLAY PANEL AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xueguang Hao, Beijing (CN); Yong Qiao, Beijing (CN); Xinyin Wu, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 17/271,319

(22) PCT Filed: Jul. 22, 2020

(86) PCT No.: PCT/CN2020/103541
§ 371 (c)(1),
(2) Date: Feb. 25, 2021

(87) PCT Pub. No.: WO2021/013181
PCT Pub. Date: Jan. 28, 2021

(65) Prior Publication Data
US 2021/0256913 A1    Aug. 19, 2021

(30) Foreign Application Priority Data
Jul. 23, 2019   (CN) .......................... 201921162475.5

(51) Int. Cl.
*G09G 3/3266*   (2016.01)
*H01L 27/32*    (2006.01)
*H01L 51/52*    (2006.01)

(52) U.S. Cl.
CPC ....... *G09G 3/3266* (2013.01); *H01L 27/3223* (2013.01); *H01L 51/529* (2013.01); *G09G 2300/0809* (2013.01)

(58) Field of Classification Search
CPC ......... G09G 3/3266; G09G 2300/0809; G09G 2300/0408; G09G 2300/0413; G09F 9/30; H01L 27/3223; H01L 51/529
See application file for complete search history.

(56) References Cited

U.S. PATENT DOCUMENTS

2017/0116923 A1    4/2017 Bae et al.
2018/0075810 A1*   3/2018 Kim .................... G09G 3/3233
(Continued)

FOREIGN PATENT DOCUMENTS

CN    107180593    9/2017
CN    107331297    11/2017
(Continued)

OTHER PUBLICATIONS

International Search Report (w/ English Translation) for corresponding PCT Application No. PCT/CN2020/103541, dated Oct. 28, 2020, 6 pages.
(Continued)

*Primary Examiner* — David Tung
(74) *Attorney, Agent, or Firm* — Dority & Manning, P.A.

(57) ABSTRACT

An array substrate has a display area and a peripheral area located outside the display area. The display area includes two first sides that are substantially parallel and arc sides connected to ends of the first sides. The array substrate includes at least one gate driving circuit. Each gate driving circuit includes GOA units sequentially distributed along each arc side in at least one arc side and active GOA units sequentially distributed along a first side connected to the arc side. The GOA units includes at least one active GOA
(Continued)

unit and at least one dummy GOA unit. Each active GOA unit is configured to provide a driving signal to at least one sub-pixel. A distance between two adjacent GOA units in the GOA units is approximately same as a distance between two adjacent active GOA units in the active GOA units.

13 Claims, 10 Drawing Sheets

(56)　　　　　References Cited

U.S. PATENT DOCUMENTS

| | | | |
|---|---|---|---|
| 2019/0189707 A1* | 6/2019 | Hyeon | ................ H01L 51/105 |
| 2019/0288009 A1 | 9/2019 | Qiao et al. | |
| 2019/0318693 A1* | 10/2019 | Jung | .................. G09G 3/3291 |
| 2020/0126470 A1* | 4/2020 | Gao | ....................... G09G 3/20 |
| 2020/0135764 A1* | 4/2020 | Ha | ......................... G09G 3/20 |

FOREIGN PATENT DOCUMENTS

| | | |
|---|---|---|
| CN | 108470522 | 8/2018 |
| CN | 105427787 | 2/2019 |
| CN | 209980755 | 1/2020 |

OTHER PUBLICATIONS

European Search Report for corresponding EP Application No. 20844705 dated Aug. 4, 2022, 19 pages.

* cited by examiner

OLED

ARRAY SUBSTRATE, DISPLAY PANEL AND DISPLAY DEVICE

CROSS-REFERENCE TO RELATED APPLICATIONS

This application is a national phase entry under 35 USC 371 of International Patent Application No. PCT/CN2020/103541, filed on Jul. 22, 2020, which claims priority to Chinese Patent Application No. 201921162475.5, filed on Jul. 23, 2019, which are incorporated herein by reference in their entirety.

TECHNICAL FIELD

The present disclosure relates to the field of display technologies, and in particular, to an array substrate, a display panel and a display device.

BACKGROUND

As shown in FIG. 1, in recent years, display panels with R corners (i.e., rounded corners or chamfered corners) have come into wide use. In order to narrow a bezel, display panels generally use a gate driver on array (GOA) technology. That is, a gate driving circuit (also called a GOA circuit) is fabricated on a base substrate of an array substrate in the display panel. The gate driving circuit includes a plurality of GOA units (also called shift registers) that are connected to a plurality of driving signal lines (such as gate lines) in the display panel in one-to-one correspondence.

SUMMARY

In an aspect, an array substrate is provided. The array substrate has a display area and a peripheral area located outside the display area. The display area includes two first sides that are substantially parallel to each other and arc sides, and at least one end of each first side is connected to an arc side in the arc sides. The array substrate includes a plurality of sub-pixels provided in the display area and at least one gate driving circuit provided in the peripheral area. Each gate driving circuit includes a plurality of GOA units sequentially distributed along each arc side in at least one of the arc sides and a plurality of active GOA units sequentially distributed along a first side connected to the arc side. The plurality of GOA units include at least one active GOA unit and at least one dummy GOA unit. Each active GOA unit is configured to provide a driving signal to at least one sub-pixel, and the at least one dummy GOA unit is a GOA unit other than the active GOA unit(s) in the plurality of GOA units. A distance between two adjacent GOA units in the plurality of GOA units is approximately the same as a distance between two adjacent active GOA units in the plurality of active GOA units.

In some embodiments, the at least one active GOA unit in the plurality of GOA units includes at least two active GOA units, and at least one dummy GOA unit is provided between two adjacent active GOA units in the plurality of GOA units.

In some embodiments, any one active GOA unit of the plurality of GOA units is closer to the plurality of active GOA units.

In some embodiments, the active GOA unit includes a plurality of transistors. At least one dummy GOA unit includes a plurality of transistors. A number of transistors in each of at least one dummy GOA unit is less than a number of transistors in the active GOA unit.

In some embodiments, a region occupied by each GOA unit includes a first region and a second region. The active GOA unit includes a first sub-circuit provided in the first region of the active GOA unit and a second sub-circuit provided in the second region of the active GOA unit. The first sub-circuit includes a plurality of transistors, and the second sub-circuit includes at least one transistor. The at least one dummy GOA unit includes a first sub-circuit provided in the first region of each dummy GOA unit, and does not include the second sub-circuit. The second region of the dummy GOA unit is located in a half, proximate to an outer edge of the peripheral area, of a region occupied by the dummy GOA unit.

In some embodiments, each active GOA unit includes a plurality of transistors coupled through a plurality of signal transmission paths. At least one dummy GOA unit includes a plurality of transistors, and positions of a plurality of transistors in each dummy GOA unit correspond to positions of the plurality of transistors in the active GOA unit. In at least one dummy GOA unit, at least one of a plurality of signal transmission paths coupled to the plurality of transistors is disconnected.

In some embodiments, a region occupied by each GOA unit includes a first region and a second region. The GOA unit includes at least one transistor provided in the first region and at least one transistor provided in the second region. In at least one dummy GOA unit, at least one of signal transmission paths coupled to transistor(s) located in the second region is disconnected as compared to signal transmission path(s) at corresponding position(s) in the active GOA unit. The second region of the dummy GOA unit is located in a half, proximate to an outer edge of the peripheral region, of a region occupied by the dummy GOA unit.

In some embodiments, the second region of the dummy GOA unit is closer to the outer edge of the peripheral area than the first region of the dummy GOA unit.

In some embodiments, the active GOA unit includes an input sub-circuit, a pull-down sub-circuit, a pull-up control sub-circuit, a pull-up sub-circuit, an output control sub-circuit, and an output sub-circuit. The input sub-circuit is connected to a signal input terminal, a first node, and a second clock signal terminal. The input sub-circuit is configured to output a voltage of the signal input terminal to the first node under control of a voltage of the second clock signal terminal. The pull-down sub-circuit is connected to a first voltage terminal, a second node, and the second clock signal terminal. The pull-down sub-circuit is configured to output a voltage of the first voltage terminal to the second node under control of the voltage of the second clock signal terminal. The pull-up control sub-circuit is connected to a first clock signal terminal, the first node, the second node, and a second voltage terminal. The pull-up control sub-circuit is configured to output a voltage of the second voltage terminal to the first node under control of voltages of the first clock signal terminal and the second node. The pull-up sub-circuit is connected to the second node, the second voltage terminal, and a signal output terminal. The pull-up sub-circuit is configured to output the voltage of the second voltage terminal to the signal output terminal under control of the voltage of the second node. The output control sub-circuit is connected to the first node, the first voltage terminal, and the output sub-circuit. The output control sub-circuit is configured to control an on-off between the output sub-circuit and the first node through the voltage of the first voltage terminal. The output sub-circuit is connected to the output control sub-circuit, the first clock signal terminal, and the signal output terminal. The output sub-circuit is configured to output a voltage of the first clock signal terminal to the signal output terminal under control of a voltage of the first node when the output control sub-circuit is turned on.

In some embodiments, the region occupied by each GOA unit includes the first region and the second region, in the active GOA unit, at least part of transistors in the input sub-circuit and/or at least part of transistors in the pull-down sub-circuit are located in the second region of the active GOA unit, and remaining transistors in the active GOA unit are located in a first region of the active GOA unit. Each dummy GOA unit in at least one dummy GOA unit includes transistors corresponding to the remaining transistors in a first region of the dummy GOA unit, and does not include at least one transistor corresponding to the at least part of transistors in the input sub-circuit and/or the at least part of transistors in a second region of the dummy GOA unit. The second region of the dummy GOA unit is located in a half, proximate to an outer edge of the peripheral area, of a region occupied by the dummy GOA unit.

In some embodiments, a region occupied by each GOA unit includes a first region and a second region, and the pull-up control sub-circuit includes a first control unit and a second control unit. The first control unit is connected to the second node, the second voltage terminal, and the second control unit. The second control unit is further connected to the first node and the first clock signal terminal. In the active GOA unit, at least part of transistors in the first control unit and/or at least part of transistors in the second control unit are located in the second region of the active GOA unit, and remaining transistors in the active GOA unit are located in a first region of the active GOA unit. Each dummy GOA unit in at least one dummy GOA unit includes transistors corresponding to the remaining transistors in a first region of the dummy GOA unit, and does not include at least one transistor corresponding to the at least part of transistors in the first control unit and/or the at least part of transistors in the second control unit. The second region of the dummy GOA unit is located in a half, proximate to an outer edge of the peripheral area, of a region occupied by the dummy GOA unit.

In some embodiments, the at least one gate driving circuit includes two gate driving circuits. The two gate driving circuits are located at outer sides of the two first sides and arc sides connected to the two first sides in the peripheral area.

In another aspect, a display panel is provided. The display panel includes the array substrate according to any one of the above embodiments.

In yet another aspect, a display device is further provided. The display device includes the display panel according to any one of the above embodiments.

BRIEF DESCRIPTION OF THE DRAWINGS

In order to describe technical solutions in the present disclosure or in the related art more clearly, the accompanying drawings to be used in the description of some embodiments of the present disclosure or the related art will be introduced briefly below. Obviously, the accompanying drawings to be described below are merely drawings of some embodiments of the present disclosure. A person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
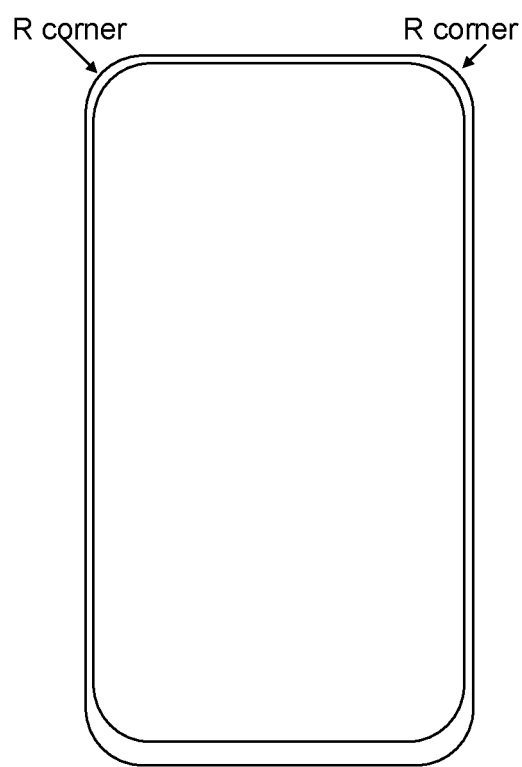
FIG. 1 is a structural diagram of a special-shaped display panel.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, the term "comprise/include" and other forms thereof such as the third-person singular form "comprises/includes" and the present participle form "comprising/including" throughout the description and the claims are construed as an open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first", "second" and similar words are only used to distinguish different components, and cannot be understood as indicating or implying any order, relative importance, or implicitly indicating the number of indicated technical features. Therefore, a feature defined with the term "first" or "second" may include one or more of the features, either explicitly or implicitly. In the description of the embodiments of the present disclosure, "a/the plurality of" means two or more unless otherwise specified.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The expression "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of "applicable to" or "configured to" indicates an open and inclusive meaning, which does not exclude apparatuses that are applicable to or configured to perform additional tasks or steps.

In addition, the use of "based on" indicates an open and inclusive meaning, since a process, step, calculation or other action that is "based on" one or more of the stated conditions or values may, in practice, be based on additional conditions or values exceeding those stated.

The term "about", "approximately" or "substantially" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

In addition, in this application, orientation terms such as "upper", "lower", "left", "right", "horizontal", and "vertical" are defined relative to a direction in which components are schematically placed in the drawings. It will be understood that these directional terms are relative concepts and are used for relative description and clarification, which may be changed correspondingly according to changes in the direction in which the components are placed in the drawings.

Some embodiments of the present disclosure provide a display device. The display device may be a TV, a mobile phone, a desktop computer, a notebook computer, a tablet computer, a personal digital assistant (PDA), a vehicle-mounted computer, etc. The embodiments of the present disclosure do not particularly limit a specific form of the display device. FIG. 1 illustrates an example in which the display device is a mobile phone.

The display device provided in the embodiments of the present disclosure includes at least a display panel. The display panel includes an array substrate, a gate driving circuit, a source driving circuit, a timing control circuit (TCON), a printed circuit board (PCB), a flexible printed circuit board (FPCB) and other electronic accessories.

The display panel may be an organic light-emitting diode (OLED) display panel, a quantum dot light-emitting diode (QLED) display panel, or a micro light-emitting diode (Micro LED) display panel, which is not specifically limited in the present disclosure.

OLED display panels have received widespread attention and are praised as a new generation of display technology due to their advantages such as self-luminescence, lightness and thinness, low power consumption, high contrast, high color gamut, and ability to realize flexible display. For the convenience of description, the present disclosure is described by taking an example where the display panel is an OLED display panel in the following embodiments of the present disclosure.

Figure 2:
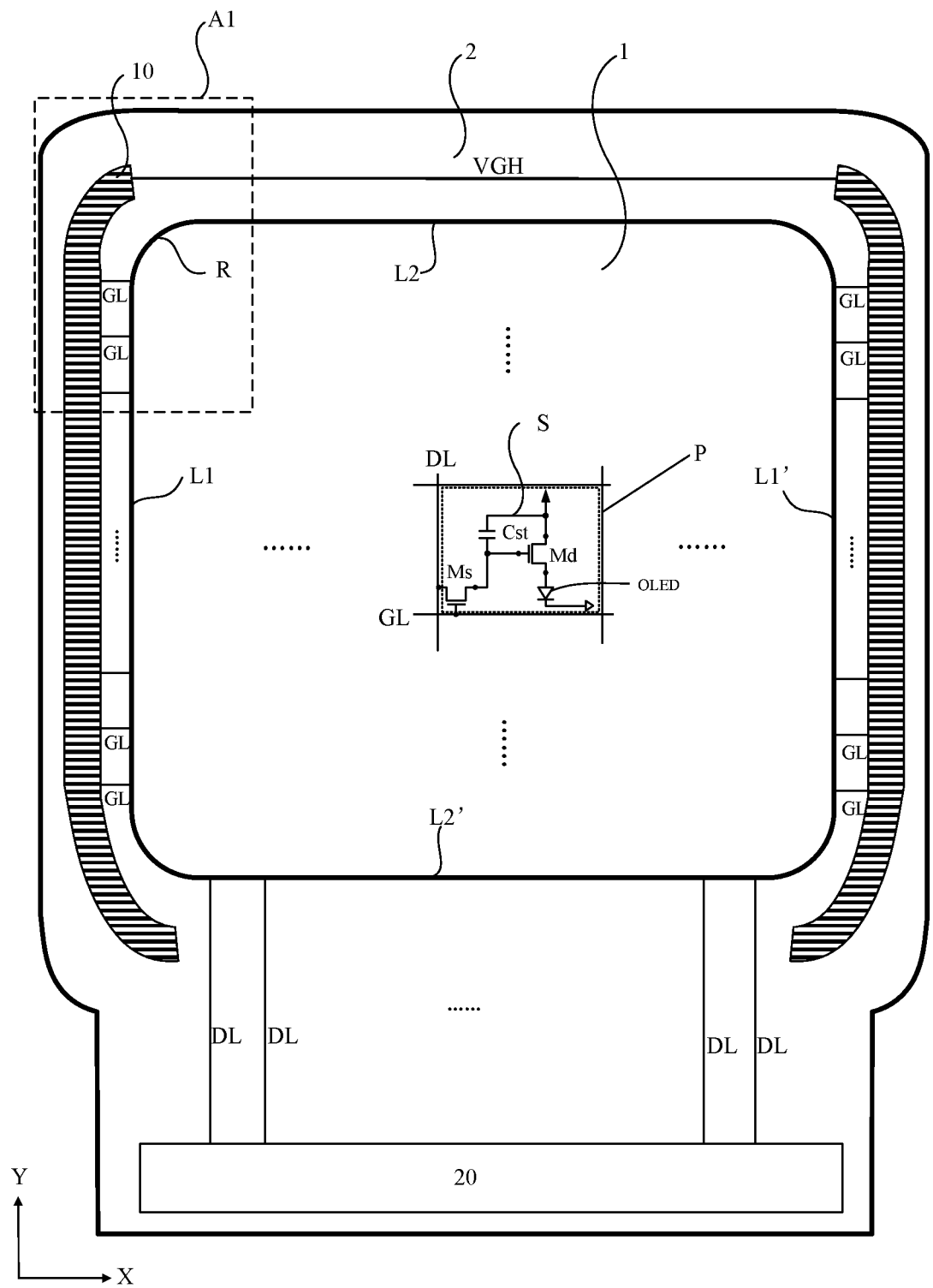
FIG. 2 is a structural diagram of a display panel (an array substrate), according to some embodiments of the present disclosure.

FIG. 2 is a structural diagram of a display panel, according to some embodiments of the present disclosure. Referring to FIG. 2, the display panel 001 includes a display area (also called an active area (AA area), or an active display area) 1 and a peripheral area 2 located outside the display area 1. FIG. 2 illustrates an example in which the peripheral area 2 is arranged around the display area 1.

Referring to FIG. 2, a plurality of gate lines GL and a plurality of data lines DL are provided in the display panel 001, and the plurality of gate lines GL and the plurality of data lines DL cross each other in the display area 1 to define a plurality of sub-pixels P.

The plurality of sub-pixels P located in the display area 1 at least include sub-pixels of a first color, sub-pixels of a second color and sub-pixels of a third color. The first color, the second color and the third color are three primary colors (e.g., red, green, and blue).

For the convenience of description, the present application is described by taking an example in which the plurality of sub-pixels P are arranged in a matrix. In this case, the gate lines GL extend in a horizontal direction X, and the data lines DL extend in a vertical direction Y. Sub-pixels P arranged in a line in the horizontal direction X are referred to as sub-pixels in a same row. Sub-pixels P arranged in a line in the vertical direction Y are referred to as sub-pixels in a same column.

In addition, as shown in FIG. 2, each sub-pixel P is provided with a pixel circuit S (also called a pixel driving circuit), and the pixel circuit S includes a driving unit and a light-emitting unit.

The driving unit includes a transistor and a capacitor. FIG. 2 illustrates an example in which the driving unit in the pixel circuit S is of 2T1C structure (that is, the driving unit includes a driving transistor Md, a switching transistor Ms, and a storage capacitor Cst). However, the present disclosure is not limited thereto, and the driving unit may adopt a 3T1C, 4T1C, or other structures in some embodiments.

Figure 3:
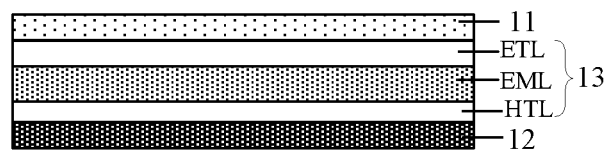
FIG. 3 is a structural diagram of an organic light-emitting diode (OLED), according to some embodiments of the present disclosure.

The light-emitting unit includes an organic light-emitting diode (OLED). Referring to FIG. 3, the OLED includes a cathode 11, an anode 12, and a light-emitting functional layer 13 located between the cathode 11 and the anode 12. The light-emitting functional layer 13 may include an organic emission layer (EML), and may further include a hole transport layer (HTL) located between the EML and the anode 12, and/or an electron transport layer (ETL) located between the EML and the cathode 11. Of course, according to needs, in some embodiments, a hole injection layer (HIL) may further be provided between the HTL and the anode 12, and/or an electron injection layer (EIL) may further be provided between the ETL and the cathode 11, which is not limited in the present disclosure.

During display, voltages applied to the cathode 11 and the anode 12 are controlled to inject holes using the anode 12 and inject electrons using the cathode 11. The formed electrons and holes meet at the EML to generate excitons, thereby exciting the EML to emit light. A magnitude of a driving current in a current path formed by the cathode 11 and the anode 12 is controlled using a driving sub-circuit in the pixel circuit S of the sub-pixel P, so that the EML emit light of different brightness, so as to realize display of different gray scales.

Based on this, as shown in FIG. 2, the display panel 001 is further provided, in the peripheral area 2 thereof, with gate driving circuit(s) (also called GOA circuit(s)) 10 connected to driving signal lines such as the gate lines GL, and a data driving circuit 20 connected to the data lines DL. Accompanying drawings of the embodiments of the present disclosure all take an example in which the gate line GL is connected to the gate driving circuit 10. The driving signal line is, for example, a gate line or an emission control line.

In some embodiments, the gate driving circuit(s) 10 may be provided in the peripheral area 2 in an extending direction of the gate line GL, and the data driving circuit 20 may be provided in the peripheral area 2 in an extending direction of the data line DL. The pixel circuits S are turned on row by row through the gate driving circuit(s) 10, and when pixel circuits S in a certain row are turned on, pixel data voltages are written into the pixel circuits S in the row through the data driving circuit 20 to realize image display.

In embodiments of the present disclosure, in order to narrow a bezel of the display device and reduce the manufacturing cost, the gate driving circuit(s) 10 are directly integrated on the array substrate in the display panel 001.

Since a structural diagram of the array substrate in the display panel 001 is basically the same as the structural diagram of the display panel 001 shown in FIG. 2 (but it does not mean that structures of the two are the same), the array substrate 100 and the GOA circuit 10 on a base substrate of the array substrate 100 will be further described below with reference to FIG. 2.

In a special-shaped display panel 001 (which may also be a display device or an array substrate) provided in the embodiments of the present disclosure, as shown in FIG. 2, the display area 1 includes two first sides L1 and L1' that are substantially parallel to each other and two second sides L2 and L2' that are substantially parallel to each other, and the first side L1 and the second side L2 are substantially perpendicular to each other. At least one end of each first side is connected to a corresponding second side through an arc side R (also called a rounded corner, a chamfered corner, or an R corner). That is, the display area 1 of the display panel 001 is provided with at least two R corners.

In some embodiments, the display area 1 includes a plurality of R corners.

For example, as shown in FIG. 2, in some embodiments, the display area 1 may include two first sides (L1 and L1') that are substantially parallel to each other, and two second sides (L2 and L2') that are substantially parallel to each other. The first side L1 and the second side L2 are substantially perpendicular to each other. Two ends of each first side (L1 or L1') are connected to the two second sides (L2 and L2') through the R corners, respectively. In this case, the display area 1 includes four R corners.

For example, in some other embodiments, the display area 1 may include two first sides (L1 and L1') that are substantially parallel to each other and two second sides (L2 and L2') that are substantially parallel to each other. The first side L1 and the second side L2 are substantially perpendicular to each other. The two first sides (L1 and L1') are connected to one second side (L2) through the R corners, respectively. In this case, the display area 1 includes two R corners.

All the following embodiments of the present disclosure are further illustrated by taking an example in which the display area 1 includes four R corners, as shown in FIG. 2.

In some embodiments, as shown in FIG. 2, the array substrate 100 is provided with GOA circuits 10 in the peripheral area 2 at both sides of the display area 1 in the extending direction of the gate line GL. Of course, in some embodiments, the GOA circuit may be provided in the peripheral area 2 at only one side of the display area 1 in the extending direction of the gate line GL.

Figure 4A:
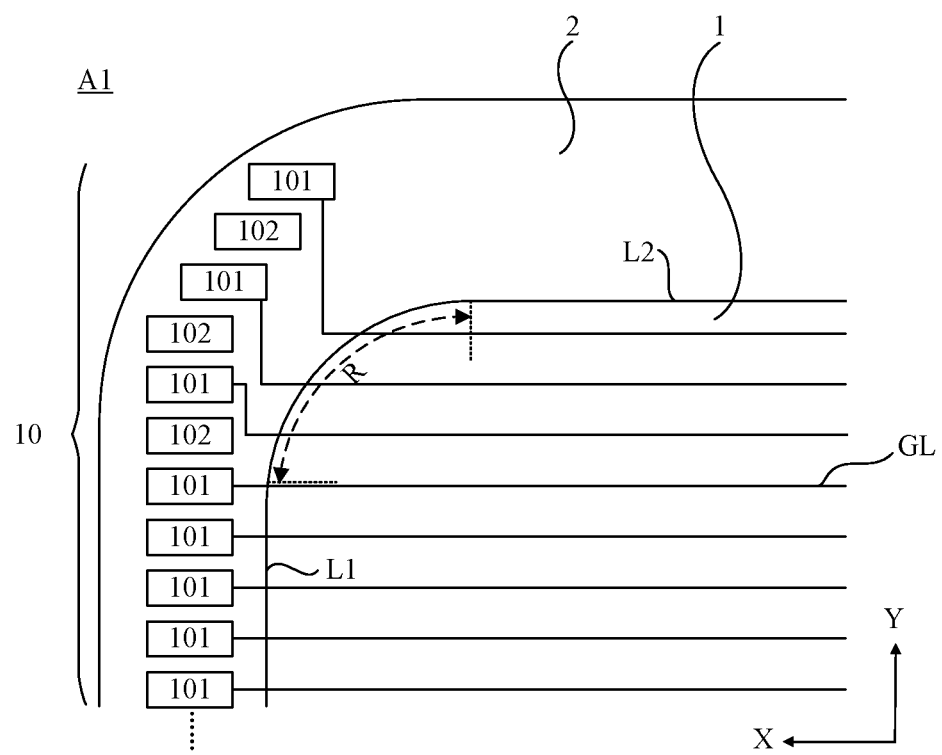
FIG. 4A is an enlarged structural view of A1 in FIG. 2.
Figure 4B:
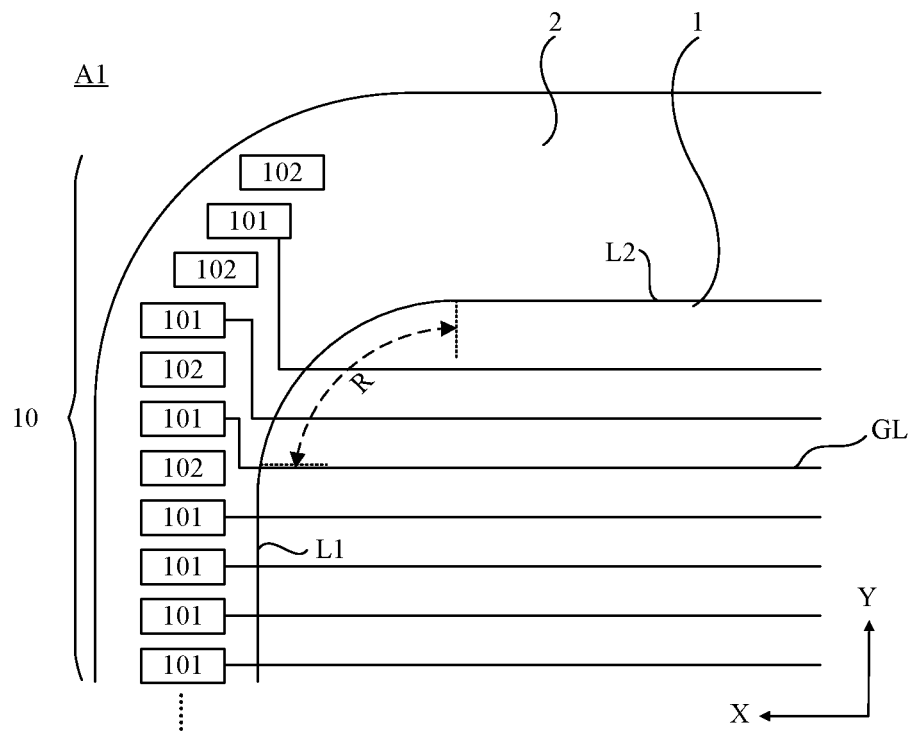
FIG. 4B is another enlarged structural view of A1 in FIG. 2.
Figure 4C:
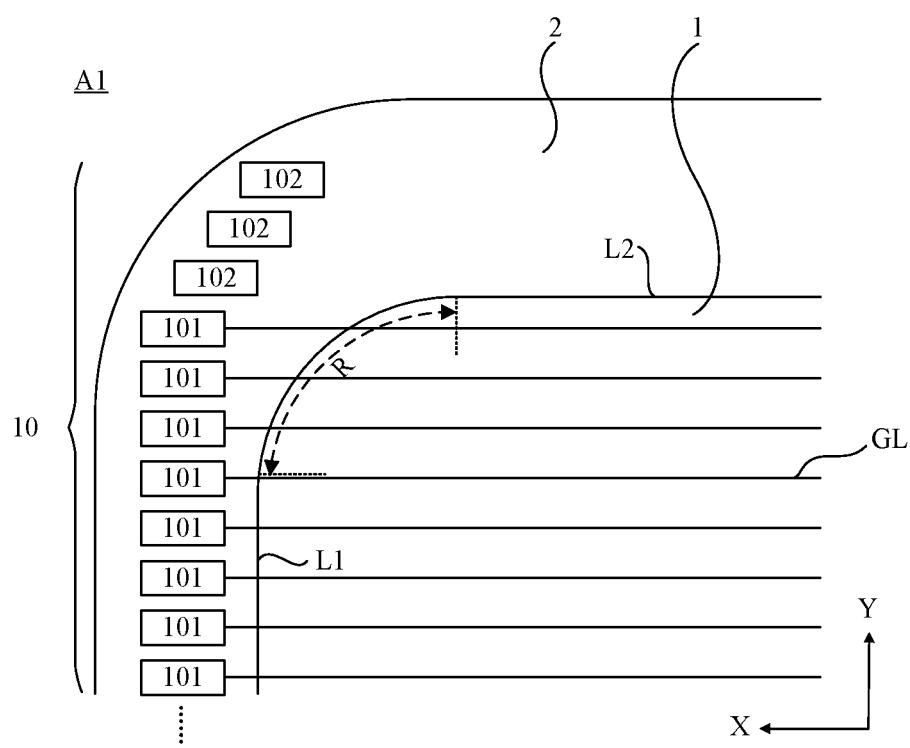
FIG. 4C is yet another enlarged structural view of A1 in FIG. 2.

In this case, for one GOA circuit 10 provided on the base substrate of the array substrate 100, as shown in FIGS. 4A, 4B and 4C (FIGS. 4A, 4B and 4C are partial enlarged views of the A1 area in FIG. 2), the GOA circuit 10 includes: a plurality of GOA units sequentially distributed along each of at least one arc side R, and a plurality of active GOA units 101 sequentially distributed along a first side L1 connected to the arc side R. The plurality of GOA units include at least one active GOA unit 101 and at least one dummy GOA unit 102. Each active GOA unit 101 is configured to provide a driving signal (i.e., a scan signal or an emission control signal) to at least one sub-pixel P. The at least one dummy GOA unit 102 is a GOA unit other than the active GOA unit(s) in the plurality of GOA units.

A distance between two adjacent GOA units in the plurality of GOA units sequentially distributed along the at least one arc side R is approximately the same as a distance between two adjacent active GOA units 101 in the plurality of active GOA units 101 sequentially distributed along the first side L1 connected to the arc side R.

It will be noted that the number of active GOA units 101 and dummy GOA units 102 in the plurality of GOA units sequentially distributed along the arc side R is not limited, and the number of active GOA units 101 and dummy GOA units 102 may be set according to a size of a space at a position proximate to the arc side R in the peripheral area 2.

Here, the dummy GOA unit 102 may provide a driving signal to at least one dummy sub-pixel located in the peripheral area 2. Of course, the dummy GOA unit 102 may not output a signal. That is, the dummy GOA unit 102 may not provide a signal to any sub-pixel P.

Based on this, the distribution of the active GOA unit(s) 101 and the dummy GOA unit(s) 102 in the plurality of GOA units sequentially distributed along the arc side R is not limited. Two specific examples are provided below, but the embodiments of the present disclosure include, but are not limited to, the following two examples.

EXAMPLE 1

As shown in FIGS. 4A and 4B, at least one dummy GOA unit 102 is provided between two adjacent active GOA units 101 in the plurality of GOA units sequentially distributed along each of the at least one arc side R.

Here, one dummy GOA unit 102 may be provided between two adjacent active GOA units 101, or two or more dummy GOA units 102 may be provided between two adjacent active GOA units 101, which is not limited. The number of dummy GOA units 102 provided between two adjacent active GOA units 101 may be set according to a distance between the two adjacent active GOA units 101. FIGS. 4A and 4B both illustrate an example in which only one dummy GOA unit 102 is provided between two adjacent active GOA units 101.

In addition, the GOA units located at two ends of the plurality of GOA units sequentially distributed along the arc side R may both be active GOA units 101, as shown in FIG. 4A, or may both be dummy GOA units 102, as shown in FIG. 4B. Of course, it may also be that the GOA unit located at one end of the plurality of GOA units sequentially distributed along the arc side R is an active GOA unit 101, and the GOA unit located at another end is a dummy GOA unit 102.

EXAMPLE 2

As shown in FIG. 4C, any one active GOA unit 101 of the plurality of GOA units sequentially distributed along each of the at least one arc side R is closer to the plurality of active GOA units 101 sequentially distributed along the first side L1 than all dummy GOA units 102.

Here, in a case where the plurality of GOA units sequentially distributed along the arc side R include a plurality of active GOA units 101, the plurality of active GOA units 101 are continuously arranged (that is, no dummy GOA unit 102 is provided between two adjacent active GOA units 101). The plurality of active GOA units 101 are closer to the plurality of active GOA units 101 sequentially distributed along the first side L1 than all the dummy GOA units 102 in the plurality of GOA units sequentially distributed along the arc side R. In a case where the plurality of GOA units sequentially distributed along the arc side R include a plurality of dummy GOA units 102, the plurality of dummy GOA units 102 are continuously arranged (that is, no active GOA unit 101 is provided between two adjacent dummy GOA units 102). The plurality of dummy GOA units 102 are farther away from the plurality of active GOA units 101 sequentially distributed along the first side L1 than all the active GOA units 101 in the plurality of GOA units sequentially distributed along the arc side R.

In the embodiments of the present disclosure, since the active GOA unit 101 is configured to provide a driving signal to the sub-pixel(s) P located in the display area 1, a signal line needs to be provided between the active GOA unit 101 and the sub-pixel(s) P in the display area 1. In a case where any one active GOA unit 101 of the plurality of GOA units sequentially distributed along each of the at least one arc side R is closer to the plurality of active GOA units 101 sequentially distributed along the first side L1 than all dummy GOA units 102, a length of the signal line may be reduced to facilitate wiring.

For the display panel 1, since at least one end of each first side L1 of the display area 1 is connected to a second side L2 through an arc side R, there is a relatively large space at the position proximate to the arc side R in the peripheral area 2. In the design of the GOA circuit in the related art, the GOA circuit 10 includes a plurality of active GOA units 101 sequentially distributed along a first side L1. In this case, if distances between every two adjacent active GOA units 101 are substantially the same, there will be a relatively large blank area (i.e., an area where no trace or device is provided) at a position proximate to an arc side R in the peripheral area 2 (i.e., a position indicated by a dashed circle in FIG. 5). In this way, during a patterning process, a concentration of an etching solution at the position proximate to the arc side R in the peripheral area 2 is significantly different from a concentration of the etching solution at positions other than the position proximate to the arc side R in the peripheral area 2, resulting in poor etching uniformity at the position proximate to the arc side R in the peripheral area 2. For example, there may be a problem such as over-etching at the position proximate to the arc side R in the peripheral area 2, resulting in poor electrical properties (i.e., poor electrical stability) of the active GOA circuits 101 located at the position proximate to the arc side R in the peripheral area 2.

Figure 5:
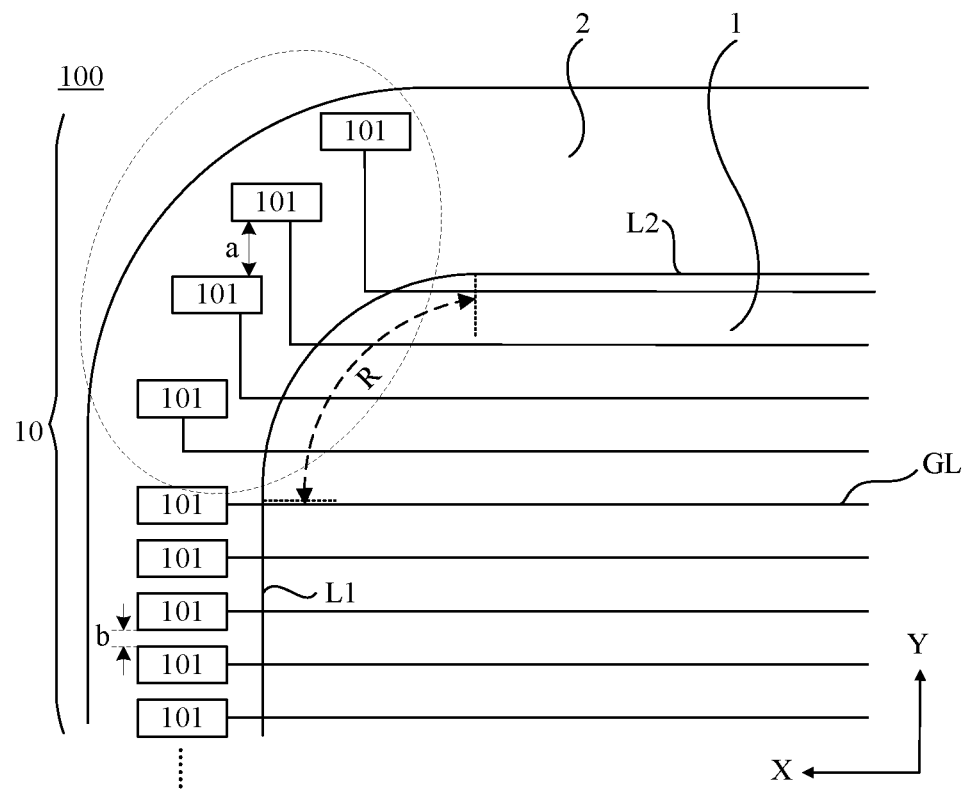
FIG. 5 is a diagram of a local structure of an array substrate, according to the related art.

In order to solve the above problems, in the related art, in order to improve the design of the GOA circuit 10, as shown in FIG. 5, the GOA circuit 10 includes a plurality of active GOA units 101 that are sequentially distributed along a first side L1 and at least one arc side R connected to the first side L1, and a distance a between two adjacent active GOA units 101 located at the position proximate to the arc side R in the peripheral area 2 is greater than a distance b between two adjacent active GOA units 101 located at positions other than the position proximate to the arc side R in the peripheral area 2. In this way, the active GOA units 101 will occupy part of the space at the position proximate to the arc side R in the peripheral area 2, and an area of the blank area will be reduced. Therefore, it may be possible to alleviate the problems of poor etching uniformity at the position proximate to the arc side R in the peripheral area 2 and poor electrical properties of the active GOA circuits 101 located at the position proximate to the arc side R in the peripheral area 2.

However, since the distance a between adjacent active GOA units 101 located at the position proximate to the arc side R in the peripheral area 2 is different from the distance b between two adjacent active GOA units 101 located at positions other than the position proximate to the arc side R in the peripheral area 2, a size of a blank area between adjacent active GOA units 101 located at the position proximate to the arc side R in the peripheral area 2 is different from a size of a blank area between two adjacent active GOA units 101 located at positions other than the position proximate to the arc side R in the peripheral area 2. Thus, the problems of poor etching uniformity at the position proximate to the arc side R in the peripheral area 2 and poor electrical properties of the active GOA circuits 101 located at the position proximate to the arc side R in the peripheral area 2 will still exist.

In the array substrate 100 provided by the embodiments of the present disclosure, and a GOA circuit 10 of the array substrate 100 includes: a plurality of GOA units sequentially distributed along each of at least one arc side R and a plurality of active GOA units 101 sequentially distributed along a first side L1 connected to the arc side R. The plurality of GOA units include at least one active GOA unit 101 and at least one dummy GOA unit 102. A distance between two adjacent GOA units in the plurality of GOA units sequentially distributed along each of the at least one arc side R is approximately the same as a distance between two adjacent active GOA units 101 in the plurality of active GOA units 101 sequentially distributed along the first side L1 connected to the arc side R. Since the GOA circuit 10 provided in the embodiments of the present disclosure includes not only active GOA unit(s) 101, but also dummy GOA unit(s) 102, and the dummy GOA unit(s) 102 occupy part of the space at the position proximate to the arc side R in the peripheral area 2, the area of the blank area may be reduced. In addition, since the distance between two adjacent GOA units in the plurality of GOA units sequentially distributed along each of the at least one arc side R is approximately the same as the distance between two adjacent active GOA units 101 in the plurality of active GOA units 101 sequentially distributed along the first side L1 connected to the arc side R, the size of the blank area between any adjacent GOA units 101 is approximately the same. In this way, it may be possible to avoid the problems of poor etching uniformity at the position proximate to the arc side R in the peripheral area 2 and poor electrical properties of the active GOA circuits 101 located at the position proximate to the arc side R in the peripheral area 2.

It will be understood that both the active GOA unit 101 and the dummy GOA unit 102 are mainly composed of transistors. The specific structures of the active GOA unit 101 and the dummy GOA unit 102 are not limited, and several possible implementation manners are provided below.

In a first possible implementation manner, the active GOA unit 101 includes a plurality of transistors, and at least one dummy GOA unit 102 includes a plurality of transistors. The number of transistors in each of at least one dummy GOA unit 102 is less than the number of transistors in the active GOA unit 101.

Here, it may be that the number of transistors in one dummy GOA unit 102 is less than the number of transistors in the active GOA unit 101. It may also be that the number of transistors in each of part of the plurality of dummy GOA units 102 is less than the number of transistors in the active GOA unit 101. Of course, it may even be that the number of transistors in each of the plurality of dummy GOA units 102 is less than the number of transistors in the active GOA unit 101, which is not limited.

In summary, the number of transistors in each of at least one dummy GOA unit 102 is set to be less than the number of transistors in the active GOA unit 102 (that is, the number of transistors in each of at least one dummy GOA unit 102 is reduced as compared with the number of transistors in the active GOA unit 101), so that part of a space at the position proximate to the arc side R in the peripheral area 2 may be released. This arrangement facilitates the wiring at the position proximate to the arc side R in the peripheral area 2, thereby avoiding problems such as short circuits in traces arranged at the position proximate to the arc side R in the peripheral area 2 caused by a too small space.

A specific arrangement in which the number of transistors in each of at least one dummy GOA unit 102 is less than the number of transistors in the active GOA unit 101 is further described below.

Figure 6:
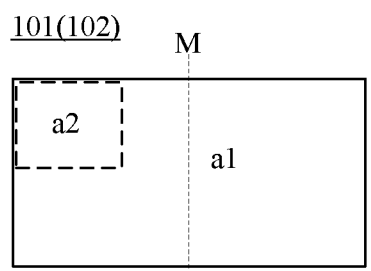
FIG. 6 is a diagram showing regional divisions of a dummy GOA circuit and an active GOA circuit, according to some embodiments of the present disclosure.
Figure 7:
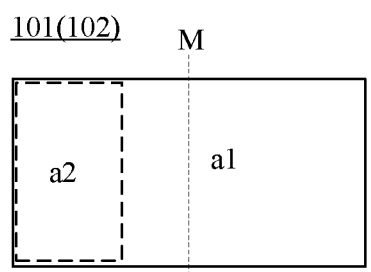
FIG. 7 is another diagram showing regional distributions of a dummy GOA circuit and an active GOA circuit, according to some embodiments of the present disclosure.

In some embodiments, as shown in FIGS. 6 and 7, a region occupied by each GOA unit includes a first region a1 and a second region a2. The active GOA unit 101 includes a first sub-circuit provided in the first region a1 of the active GOA unit 101 and a second sub-circuit provided in the second region a2 of the active GOA unit 101. The first sub-circuit includes a plurality of transistors, and the second sub-circuit includes at least one transistor. At least one dummy GOA unit 102 includes a first sub-circuit provided in the first region a1 of each dummy GOA unit 102, and does not include the second sub-circuit (that is, the second region a2 of at least one dummy GOA unit 102 is not provided with a transistor). The second region a2 of the dummy GOA unit 102 is located in a half, proximate to an outer edge of the peripheral area 2, of a region occupied by the dummy GOA unit 102.

It will be noted that, in FIGS. 6 and 7, a center line M divides the region occupied by the dummy GOA unit 102 into two regions of equal area. A region at a left side of the center line M is a half of the region occupied by the dummy GOA unit 102, and a region at a right side of the center line M is a half of the region occupied by the dummy GOA unit 102. Regions other than the marked second regions a2 are the first regions a1 in FIGS. 6 and 7.

Here, the peripheral area 2 has two edges, i.e., an inner edge and an outer edge. The inner edge overlaps with an edge of the display area 1.

As can be seen from the above, since at least one dummy GOA unit 102 does not include the second sub-circuit, it may be understood as that the second sub-circuit(s) in at least one dummy GOA unit 102 are removed as compared with those of the active GOA unit 101.

It will be understood that the first sub-circuit provided in the first region a1 of the active GOA unit 101 has a same circuit structure as the first sub-circuit provided in the first region a1 of the dummy GOA unit 102.

Figure 10:
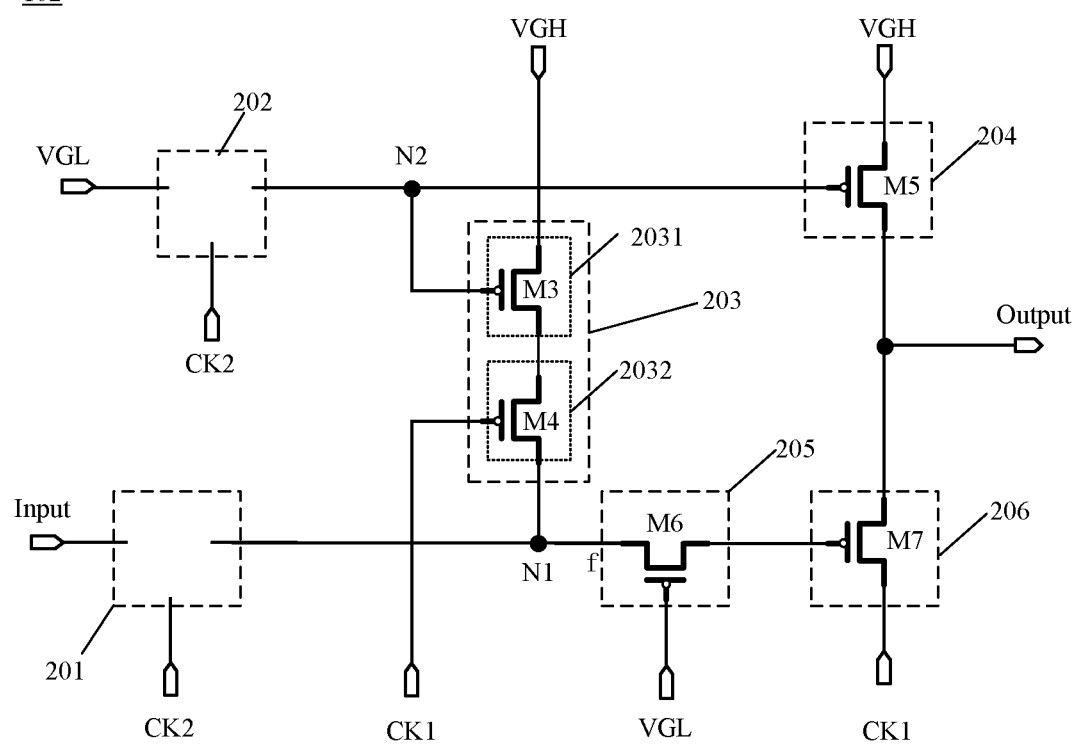
FIG. 10 is a circuit configuration diagram of a dummy GOA unit, according to some embodiments of the present disclosure.

For example, referring to FIG. 10, structures and connection relationships of the transistors (transistors M3 to M7) provided in the first region a1 of the dummy GOA unit 102 are identical to those of the transistors (transistors M3 to M7) provided in the first region a1 of the active GOA unit 101.

Since multiple traces of the array substrate 100 usually pass from a side of the GOA unit proximate to the edge of the peripheral area 2, in the embodiments of the present disclosure, it is arranged that the second region a2 of the dummy GOA unit 102 is located in the half, proximate to the outer edge of the peripheral area 2, of the region occupied by the dummy GOA unit 102. By removing the second sub-circuit, that is, by removing the transistors in the second region of the dummy GOA unit 102, it may be possible to release part of the space in the peripheral area 2 proximate to the outer edge of the peripheral area 2, which facilitates wiring.

Based on this, the position of the first region a1 of the dummy GOA unit 102 is not limited. It may be that at least part of the first region a1 of the dummy GOA unit 102 is also located proximate to the outer edge of the peripheral area 2, as shown in FIG. 6. That is, at least part of the transistors of the first sub-circuit are located proximate to the outer edge of the peripheral area 2. Of course, it may also be that the second region a2 of the dummy GOA unit 102 is closer to the outer edge of the peripheral area 2 than the first region a1 of the dummy GOA unit 102, as shown in FIG. 7.

Since the second region a2 of the dummy GOA unit 102 does not include second sub-circuit, in a case where the second region a2 of the dummy GOA unit 102 is closer to the outer edge of the peripheral area 2 than the first region a1 of the dummy GOA unit 102, by providing zero transistors in a region of the region occupied by the dummy GOA unit 102 proximate to the outer edge of the peripheral area 2, it may be possible to release a larger space to facilitating wiring.

Specific structures of the active GOA unit 101 and the dummy GOA unit 102 are not limited. A structure of the active GOA unit 101 is exemplarily described below. Those skilled in the art will understand that the embodiments of the present disclosure include but are not limited to the structure of the active GOA unit 101 described below.

Figure 8:
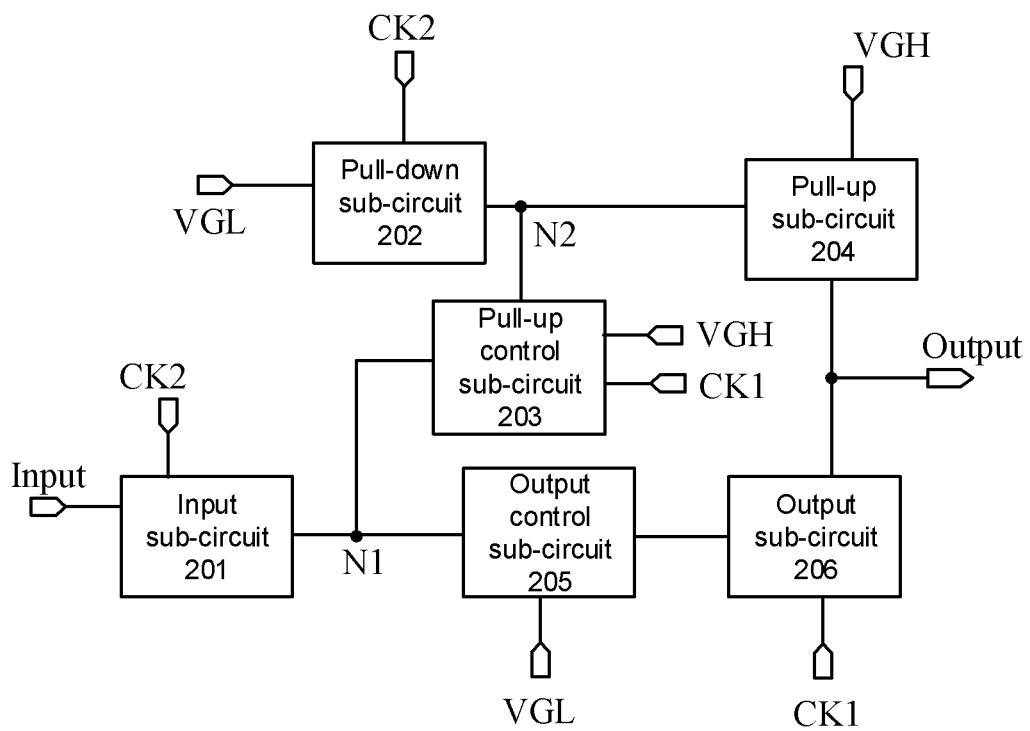
FIG. 8 is a structural diagram of an active GOA unit, according to some embodiments of the present disclosure.

In some embodiments, as shown in FIG. 8, the active GOA unit 101 may include an input sub-circuit 201, a pull-down sub-circuit 202, a pull-up control sub-circuit 203, a pull-up sub-circuit 204, an output control sub-circuit 205, and an output sub-circuit 206.

As shown in FIG. 8, the input sub-circuit 201 is connected to a signal input terminal Input, a first node N1, and a second clock signal terminal CK2. The input sub-circuit 201 is configured to output a voltage of the signal input terminal Input to the first node N1 under control of a voltage of the second clock signal terminal CK2.

Figure 9:
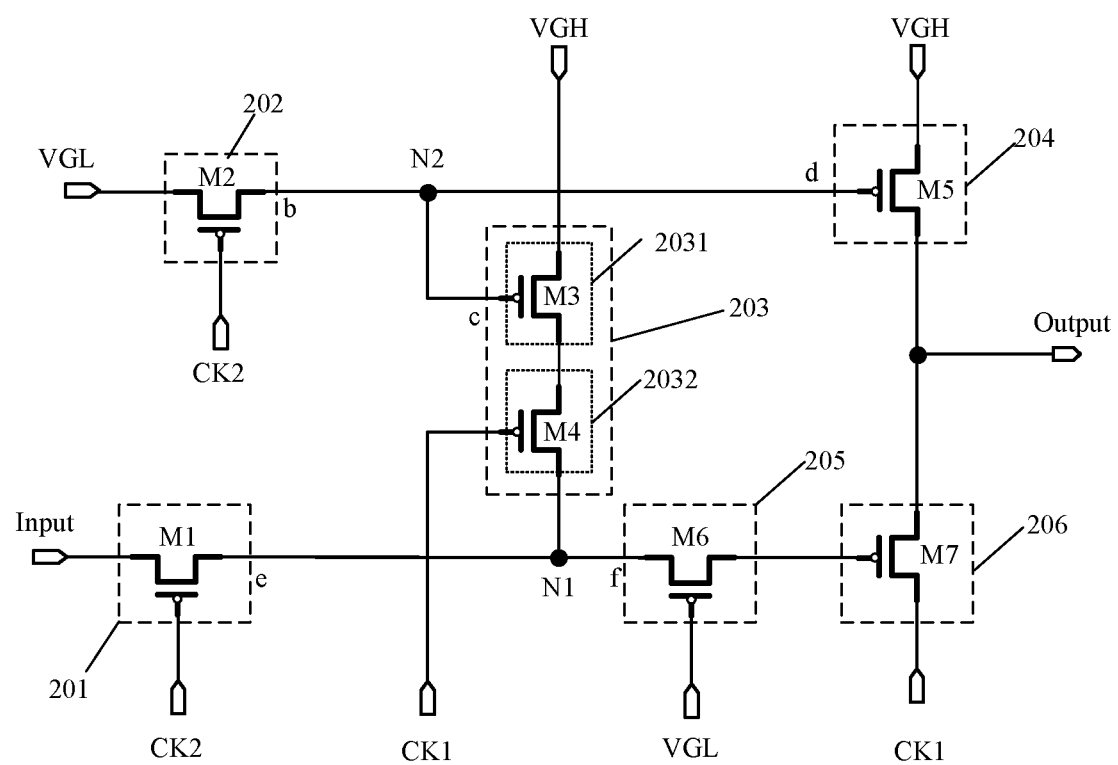
FIG. 9 is a circuit configuration diagram of an active GOA unit, according to some embodiments of the present disclosure.

For example, in some embodiments, as shown in FIG. 9, the input sub-circuit 201 include a first transistor M1. A gate of the first transistor M1 is connected to the second clock signal terminal CK2, a first electrode of the first transistor M1 is connected to the signal input terminal Input, and the second electrode of the first transistor M1 is connected to the first node N1.

As shown in FIG. 8, the pull-down sub-circuit 202 is connected to a first voltage terminal VGL, a second node N2, and the second clock signal terminal CK2. The pull-down sub-circuit 202 is configured to output a voltage of the first voltage terminal VGL to the second node N2 under control of the voltage of the second clock signal terminal CK2.

For example, in some embodiments, as shown in FIG. 9, the pull-down sub-circuit 202 may include a second transistor M2. A gate of the second transistor M2 is connected to the second clock signal terminal CK2, a first electrode of the second transistor M2 is connected to the first voltage terminal VGL, and a second electrode of the second transistor M2 is connected to the second node N2.

As shown in FIG. 8, the pull-up control sub-circuit 203 is connected to a first clock signal terminal CK1, the first node N1, the second node N2, and a second voltage terminal VGH. The pull-up control sub-circuit 203 is configured to output a voltage of the second voltage terminal VGH to the first node N1 under control of voltages of the first clock signal terminal CK1 and the second node N2.

For example, in some embodiments, as shown in FIG. 9, the pull-up control sub-circuit 203 may include a third transistor M3 and a fourth transistor M4. A gate of the third transistor M3 is connected to the second node N2, a first electrode of the third transistor M3 is connected to the second voltage terminal VGH, and a second electrode of the third transistor M3 is connected to a second electrode of the fourth transistor M4. A first electrode of the fourth transistor M4 is connected to the first node N1, and a gate of the fourth transistor M4 is connected to the first clock signal terminal CK1.

As shown in FIG. 8, the pull-up sub-circuit 204 is connected to the second node N2, the second voltage terminal VGH, and a signal output terminal Output. The pull-up sub-circuit 204 is configured to output the voltage of the second voltage terminal VGH to the signal output terminal Output under control of the voltage of the second node N2.

For example, in some embodiments, as shown in FIG. 9, the pull-up sub-circuit 204 may include a fifth transistor M5. A gate of the fifth transistor M5 is connected to the second node N2, a first electrode of the fifth transistor M5 is connected to the second voltage terminal VGH, and a second electrode of the fifth transistor M5 is connected to the signal output terminal Output.

As shown in FIG. 8, the output control sub-circuit 205 is connected to the first node N1, the first voltage terminal VGL, and the output sub-circuit 206. The output control sub-circuit 205 is configured to control an on-off between the output sub-circuit 206 and the first node N1 through the voltage of the first voltage terminal VGL.

For example, in some embodiments, as shown in FIG. 9, the output control sub-circuit 205 may include a sixth transistor M6. A gate of the sixth transistor M6 is connected to the first voltage terminal VGL, a first electrode of the sixth transistor M6 is connected to the first node N1, and a second electrode of the sixth transistor M6 is connected to the output sub-circuit 206.

As shown in FIG. 8, the output sub-circuit 206 is connected to the output control sub-circuit 205, the first clock signal terminal CK1, and the signal output terminal Output. The output sub-circuit 206 is configured to output a voltage of the first clock signal terminal CK1 to the signal output terminal Output under control of a voltage of the first node N1 when the output control sub-circuit 205 is turned on.

For example, in some embodiments, as shown in FIG. 9, the output sub-circuit 206 may include a seventh transistor M7. A gate of the seventh transistor M7 is connected to the output control sub-circuit 205 (the second electrode of the sixth transistor M6), a first electrode of the seventh transistor M7 is connected to the first clock signal terminal CK1, and a second electrode of the seventh transistor M7 is connected to the signal output terminal Output.

It will be noted that the transistors may be enhancement-mode transistors or depletion-mode transistors. In addition, since a source and a drain in a transistor are generally symmetrical in structure and composition, there is no difference between the source and the drain. In some embodiments of the present disclosure, in order to distinguish two electrodes of the transistor other than a gate, one electrode is called a source and another electrode is called a drain. Based on this, the first electrode described above may be the source, and the second electrode is the drain; or, the first electrode is the drain, and the second electrode is the source.

Based on the above, regarding the actual circuit distribution of the GOA circuits of the array substrate 100, in some embodiments, in the active GOA unit 101, at least part of the transistors in the input sub-circuit 201 and/or at least part of the transistors in the pull-down sub-circuit 202 are located in the second region of the active GOA unit 101.

Since the active GOA unit 101 includes the second sub-circuit provided in the second region of the active GOA unit 101, the second sub-circuit includes at least part of the transistors in the input sub-circuit 201 and/or at least part of the transistors in the pull-down sub-circuit 202. In a case where the at least one dummy GOA unit includes the first sub-circuit provided in the first region of each dummy GOA unit and does not include the second sub-circuit, it means that the dummy GOA unit does not include at least part of the transistors in the input sub-circuit 201 and/or at least part of the transistors in the pull-down sub-circuit 202. That is, the dummy GOA unit omits at least part of the transistors in the input sub-circuit 201 and/or at least part of the transistors in the pull-down sub-circuit 202. In this way, part of the space may be released, which facilitates wiring.

For example, in the active GOA unit 101, the input sub-circuit 201 includes the first transistor M1, the pull-down sub-circuit 202 includes the second transistor M2, and the input sub-circuit 201 and the pull-down sub-circuit 202 are both located in the second region a2. In comparison, referring to FIG. 10, since the second region a2 of the dummy GOA unit 102 is not provided with the second sub-circuit, the dummy GOA unit 102 does not include the first transistor M1 and the second transistor M2. That is, the dummy GOA unit 102 omits the first transistor M1 and the second transistor M2 as compared with the active GOA unit 101.

In some examples, referring to FIG. 9, the pull-up control sub-circuit 203 in the active GOA unit 101 may include a first control unit 2031 and a second control unit 2032. The first control unit 2031 is connected to the second node N2, the second voltage terminal VGH, and the second control unit 2032. The second control unit 2032 is further connected to the first node N1 and the first clock signal terminal CK1.

For example, in some embodiments, as shown in FIG. 9, the first control unit 2031 includes the third transistor M3, and the second control unit 2032 includes the fourth transistor M4.

In some embodiments, in a case where the pull-up control sub-circuit 203 includes the first control unit 2031 and the second control unit 2032, in the active GOA unit 101, at least part of the transistors in the first control unit 2031 and/or at least part of the transistors in the second control unit 2032 are located in the second region of the active GOA unit 101. Since the second region a2 of the dummy GOA unit 102 does not include the second sub-circuit, it means that the dummy GOA unit 102 does not include at least part of the transistors in the first control unit 2031 and/or at least part of the transistors in the second control unit 2032. That is, the dummy GOA unit 102 omits at least part of the transistors in the first control unit 2031 and/or at least part of the transistors in the second control unit 2032.

In a second possible implementation manner, each active GOA unit 101 includes a plurality of transistors coupled through a plurality of signal transmission paths. At least one dummy GOA unit 102 includes a plurality of transistors, and positions of a plurality of transistors in each dummy GOA unit 102 correspond to positions of the plurality of transistors in the active GOA unit 101. In at least one dummy GOA unit 102, at least one of a plurality of signal transmission paths coupled to the plurality of transistors is disconnected as compared to signal transmission path(s) at corresponding position(s) in the active GOA unit 101.

In the embodiments of the present disclosure, since in at least one dummy GOA unit 102, at least one of the plurality of signal transmission paths coupled to the plurality of transistors is disconnected as compared to the signal transmission path(s) at the corresponding position(s) in the active GOA unit, and the disconnected signal transmission path does not generate heat with no current flowing therethrough, a heat dissipation effect may be improved.

Here, "positions of a plurality of transistors in each dummy GOA unit 102 correspond to positions of the plurality of transistors in the active GOA unit 101" means that if the first transistor M1 in the dummy GOA unit 102 is located in an upper left corner of the region occupied by the dummy GOA unit 102, the first transistor M1 in the active GOA unit 101 is also located in an upper left corner of the region occupied by the active GOA unit 101.

It will be understood that the plurality of transistors in each active GOA unit 101 are coupled together through the plurality of signal transmission paths. In an example where the structure of the active GOA unit 101 is the structure as shown FIG. 9, for example, the second transistor M2 and the third transistor M3 are coupled through a signal transmission path bc. For another example, the second transistor M2 and the fifth transistor M5 are coupled through a signal transmission path bd. For yet another example, the first transistor M1 and the sixth transistor M6 are coupled through a signal transmission path ef.

Figure 12:
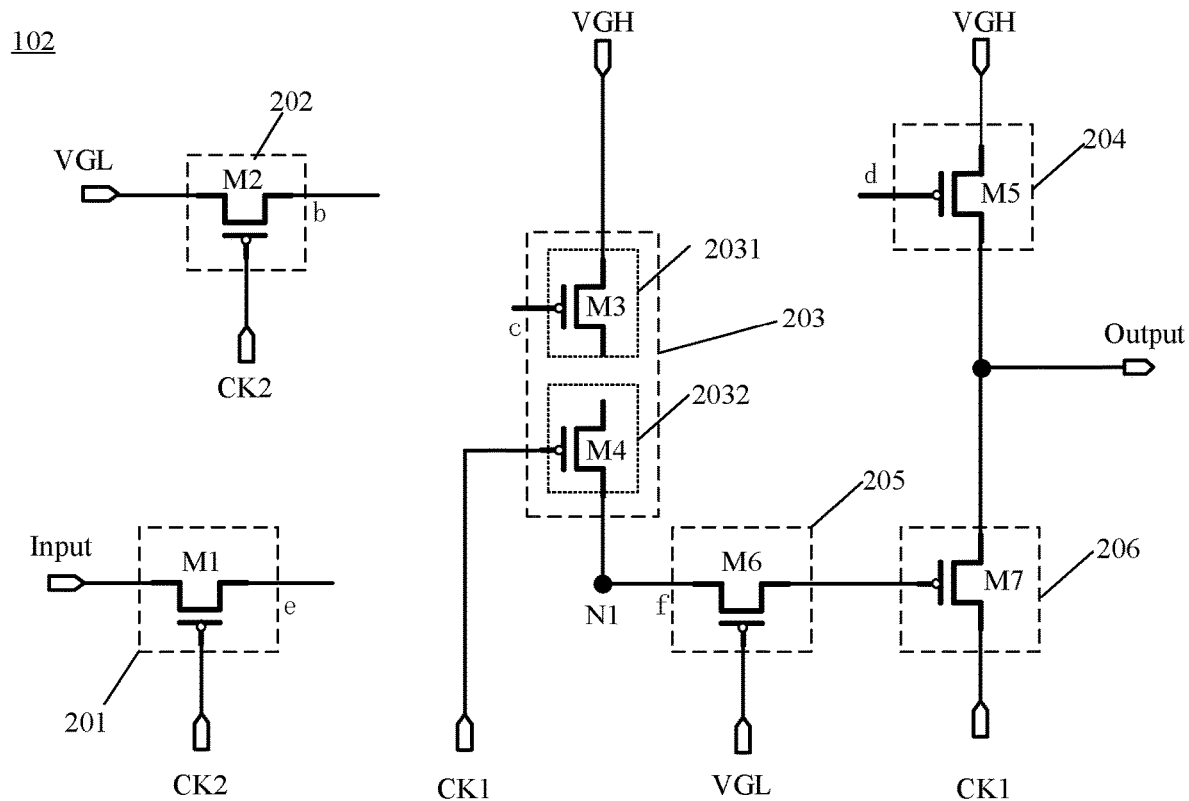
FIG. 12 is a circuit configuration diagram of another dummy GOA unit, according to some embodiments of the present disclosure.

In addition, for a dummy GOA unit 102, a position where the signal transmission path is disconnected is not limited. In the example where the structure of the active GOA unit 101 is the structure as shown in FIG. 9, compared to FIG. 9, as shown in FIG. 12, for example, the signal transmission path bc between the second transistor M2 and the third transistor M3 may be disconnected. For another example, the signal transmission path bd between the second transistor M2 and the fifth transistor M5 may be disconnected. For yet another example, the signal transmission path ef between the first transistor M1 and the sixth transistor M6 may be disconnected.

In some embodiments, a region occupied by each GOA unit includes a first region a1 and a second region a2. The GOA unit includes at least one transistor provided in the first region a1 and at least one transistor provided in the second region a2. In at least one dummy GOA unit 102, at least one of the signal transmission paths coupled to the transistor(s) located in the second region a2 is disconnected as compared to signal transmission path(s) at corresponding position(s) in the active GOA unit 101. The second region of the dummy GOA unit 102 is located in a half, proximate to an outer edge of the peripheral area 2, of a region occupied by the dummy GOA unit 102.

It will be understood that structures and connection relationships in the first region a1 of the dummy GOA unit 102 are identical to those in the first region a1 of the active GOA unit 101.

For example, referring to FIG. 12, structures and connection relationships of the transistors (transistors M3 to M7) provided in the first region a1 of the dummy GOA unit 102 are identical to those of the transistors (transistors M3 to M7) provided in the first region a1 of the active GOA unit 101.

In at least one dummy GOA unit 102, at least one of the signal transmission paths coupled to the transistor(s) located in the second region a2 is disconnected as compared to the signal transmission path(s) at the corresponding position(s) of the active GOA unit 101. The disconnected signal transmission path is located in the half, proximate to the outer edge of the peripheral area 2, of the region occupied by the dummy GOA unit 102.

Figure 11:
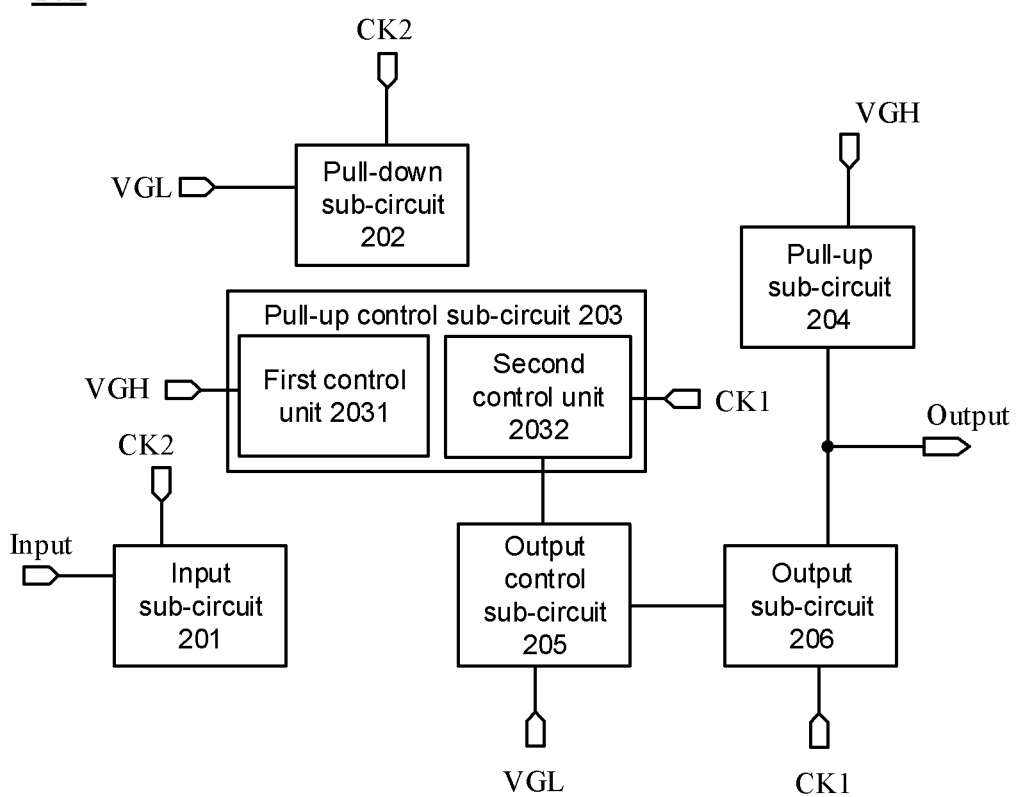
FIG. 11 is a structural diagram of a dummy GOA unit, according to some embodiments of the present disclosure.

In an example where the structure of the active GOA unit 101 is a structure as shown in FIGS. 8 and 9. In the active GOA unit 101, at least part of the transistors in the input sub-circuit 201 and/or at least part of the transistors in the pull-down sub-circuit 202 are located in the second region a2 of the active GOA unit 101. Since the positions of the plurality of transistors in each dummy GOA unit 102 correspond to the positions of the plurality of transistors in the active GOA unit 101, the second region a2 of the dummy GOA unit 102 is provided with at least part of the transistors in the input sub-circuit 201 and/or at least part of the transistors in the pull-down sub-circuit 202. In addition, since at least one of the signal transmission paths coupled to the transistor(s) located in the second region a2 is disconnected as compared to the signal transmission path(s) at the corresponding position(s) of the active GOA unit 101, as shown in FIG. 11, the signal transmission path coupled to the input sub-circuit 201 and/or the pull-up sub-circuit 202 is disconnected. That is, the signal transmission path(s) coupled to at least part of the transistors in the input sub-circuit 201 and/or at least part of the transistors in the pull-up sub-circuit 202 is disconnected. As shown in FIG. 12, the input sub-circuit 201 includes the first transistor M1, and the pull-up sub-circuit 202 includes the second transistor M2; the signal transmission path of coupled to the first transistor M1 is disconnected, and/or the signal transmission path bd and the signal transmission path be that are coupled to the second transistor M2 are disconnected.

Based on this, in the case where the pull-up control sub-circuit 203 includes the first control unit 2031 and the second control unit 2032, at least part of the transistors in the first control unit 2031 and/or at least part of the transistors in the second control unit 2032 are located in the second region a2 of the active GOA unit 101. Since the positions of the plurality of transistors in each dummy GOA unit 102 correspond to the positions of the plurality of transistors in the active GOA unit 101, the second region a2 of the dummy GOA unit 102 is provided with at least part of the transistors in the first control unit 2031 and/or at least part of the transistors in the second control unit 2032, and at least one of the signal transmission paths coupled to the transistors located in the second region a2 is disconnected as compared to the signal transmission path(s) at the corresponding position(s) of the active GOA unit 101. Therefore, as shown in FIG. 11, the signal transmission path coupled to the first control unit 2031 and/or the second control unit 2032 is disconnected. That is, as shown in FIG. 12, the signal transmission path coupled to at least part of the transistors in the first control unit 2031 and/or at least part of the transistors in the second control unit 2032 is disconnected.

For example, as shown in FIG. 12, the signal transmission path coupled to the third transistor M3 and the signal transmission path coupled to the fourth transistor M4 are disconnected.

Since multiple traces of the array substrate 100 usually pass from a side of the GOA unit proximate to the outer edge of the peripheral area 2, and in the embodiments of the present disclosure, the disconnected signal transmission paths ae located in the half of the region occupied by the dummy GOA unit 102 proximate to the outer edge of the peripheral area 2, the heat generated by a current flowing through the signal transmission path may be reduced, and the heat dissipation effect may be improved. Therefore, it may be possible to avoid an influence on the traces provided on the side of the GOA unit proximate to the outer edge of the peripheral area 2.

In some embodiments, the second region a2 of the dummy GOA unit 102 is closer to the outer edge of the peripheral area 2 than the first region a1.

Since the second region a2 of the dummy GOA unit 102 is closer to the outer edge of the peripheral area 2 than the first region a1, the signal transmission path is disconnected at a position proximate to the outer edge of peripheral area 2. Since the traces of the array substrate 100 usually pass from the side of the GOA unit proximate to the outer edge of peripheral area 2, it may be possible to further avoid the influence on the traces provided at the side of the GOA unit proximate to the outer edge of peripheral area 2.

In a third possible implementation manner, the dummy GOA unit 102 includes a plurality of transistors, and the active GOA unit 101 includes a plurality of transistors. Positions of the plurality of transistors in each dummy GOA unit 102 correspond to positions of the plurality of transistors in the active GOA unit 101, and connection relationships of the transistors at the corresponding positions are the same.

On this basis, in some embodiments, a gating signal may be input to a gate of at least one transistor in the dummy GOA unit 102, so that the at least one transistor is always in an off state. For example, in a case where at least one transistor in the dummy GOA unit 102 is an N-type transistor, a high level signal may be input to a gate of the N-type transistor, so that the N-type transistor is in the off state. Alternatively, no gating signal is input to the gate of at least one transistor in the dummy GOA unit 102, so that the at least one transistor is always in the off state. For example, the structure of the dummy GOA unit 102 is the same as that of the active GOA unit 101, both of which are the structure as shown in FIG. 9. Then, the first clock signal terminal CK1 and the second clock signal terminal CK2 may not be connected to a clock signal line. In this way, the transistors whose gates are connected to the first clock signal terminal CK1 and the second clock signal terminal CK2 will always be in the off state since the gates of the transistors are not input with the gating signal. Referring to FIG. 9, if the first clock signal terminal CK1 and the second clock signal terminal CK2 are not connected to the clock signal line, the first transistor M1, the second transistor M2 and the fourth transistor M4 will always be in the off state.

Since no current flows through transistors in the off state, heat generation may be reduced and the heat dissipation effect may be improved.

In addition, the region occupied by each GOA unit includes the first region a1 and the second region a2. When the active GOA unit 101 is operates, the transistors located in the second region a2 of the dummy GOA unit 102 are in the off state. The second region a2 of the dummy GOA unit 102 is closer to the outer edge of the peripheral area 2 than the first region a1 of the dummy GOA unit 102.

Since the transistors in the second region a2 of the dummy GOA unit 102 are in the off state, the second region a2 of the dummy GOA unit 102 does not generate heat, and thus the heat dissipation effect may be improved.

In addition, it will further be noted that besides the dummy GOA units 102 and the active GOA units 101 described above, the array substrate 100 is further provided with other signal lines, such as a clock signal line CLK, a power voltage signal line VDD, etc., regarding which reference may be made to the related art and details are not described here.

The above descriptions are only specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. An array substrate having a display area and a peripheral area located outside the display area, the display area including two first sides that are substantially parallel to each other and arc sides, at least one end of each first side being connected to an arc side in the arc sides; the array substrate comprising:
   a plurality of sub-pixels disposed in the display area; and
   at least one gate driving circuit disposed in the peripheral area, wherein each gate driving circuit includes a plurality of gate driver on array (GOA) units sequentially distributed along each arc side in at least one of the arc sides and a plurality of active GOA units sequentially distributed along a first side connected to the arc side; the plurality of GOA units include at least one active GOA unit and at least one dummy GOA unit; each active GOA unit is configured to provide a driving signal to at least one sub-pixel, and the at least one dummy GOA unit is a GOA unit other than the at least one active GOA unit in the plurality of GOA units; and
   a distance between two adjacent GOA units in the plurality of GOA units is approximately the same as a distance between two adjacent active GOA units in the plurality of active GOA units;
   wherein the active GOA unit includes a plurality of transistors; at least one dummy GOA unit includes a plurality of transistors;

a number of transistors in each of at least one dummy GOA unit is less than a number of transistors in the active GOA unit;

wherein the active GOA unit includes an input sub-circuit, a pull-down sub-circuit, a pull-up control sub-circuit, a pull-up sub-circuit, an output control sub-circuit, and an output sub-circuit;

the input sub-circuit is connected to a signal input terminal, a first node, and a second clock signal terminal; the input sub-circuit is configured to output a voltage of the signal input terminal to the first node under control of a voltage of the second clock signal terminal;

the pull-down sub-circuit is connected to a first voltage terminal, a second node, and the second clock signal terminal; the pull-down sub-circuit is configured to output a voltage of the first voltage terminal to the second node under control of the voltage of the second clock signal terminal;

the pull-up control sub-circuit is connected to a first clock signal terminal, the first node, the second node, and a second voltage terminal; the pull-up control sub-circuit is configured to output a voltage of the second voltage terminal to the first node under control of voltages of the first clock signal terminal and the second node;

the pull-up sub-circuit is connected to the second node, the second voltage terminal, and a signal output terminal; the pull-up sub-circuit is configured to output the voltage of the second voltage terminal to the signal output terminal under control of the voltage of the second node;

the output control sub-circuit is connected to the first node, the first voltage terminal, and the output sub-circuit the output control sub-circuit is configured to control an on-off between the output sub-circuit and the first node through the voltage of the first voltage terminal;

the output sub-circuit is connected to the first clock signal terminal and the signal output terminal; the output sub-circuit is configured to output a voltage of the first clock signal terminal to the signal output terminal under control of a voltage of the first node when the output control sub-circuit is turned on;

wherein a region occupied by each GOA unit includes a first region and a second region;

the pull-up control sub-circuit includes a first control unit and a second control unit; the first control unit is connected to the second node, the second voltage terminal, and the second control unit; the second control unit is further connected to the first node and the first clock signal terminal; and in the active GOA unit, at least part of transistors in the first control unit and/or at least part of transistors in the second control unit are located in the second region of the active GOA unit, and remaining transistors in the active GOA unit are located in the first region of the active GOA unit;

each dummy GOA unit in at least one dummy GOA unit includes transistors corresponding to the remaining transistors in the first region of the dummy GOA unit, and does not include at least one transistor corresponding to the at least part of transistors in the first control unit and/or the at least part of transistors in the second control unit in the second region of the dummy GOA unit, the second region of the dummy GOA unit is located in a half, proximate to an outer edge of the peripheral area, of a region occupied by the dummy GOA unit.

2. The array substrate according to claim 1, wherein the at least one active GOA unit in the plurality of GOA units includes at least two active GOA units, and at least one dummy GOA unit is provided between two adjacent active GOA units in the plurality of GOA units.

3. The array substrate according to claim 1, wherein any one active GOA unit of the plurality of GOA units is closer to the plurality of active GOA units than the at least one dummy GOA unit.

4. The array substrate according to claim 1, wherein each active GOA unit includes a plurality of transistors coupled through a plurality of signal transmission paths; and positions of a plurality of transistors in each dummy GOA unit correspond to positions of the plurality of transistors in the active GOA unit;

in at least one dummy GOA unit, at least one of a plurality of signal transmission paths coupled to the plurality of transistors is disconnected.

5. The array substrate according to claim 4, wherein the GOA unit includes at least one transistor disposed in the first region and at least one transistor disposed in the second region;

in at least one dummy GOA unit, at least one of signal transmission paths coupled to at least one transistor located in the second region is disconnected.

6. The array substrate according to claim 5, wherein the second region of the dummy GOA unit is closer to the outer edge of the peripheral area than the first region of the dummy GOA unit.

7. The array substrate according to claim 1, wherein in the active GOA unit, at least part of transistors in the input sub-circuit and/or at least part of transistors in the pull-down sub-circuit are located in the second region of the active GOA unit, and remaining transistors in the active GOA unit are located in the first region of the active GOA unit;

each dummy GOA unit in at least one dummy GOA unit further does not include at least one transistor corresponding to the at least part of transistors in the input sub-circuit and/or the at least part of transistors in the second region of the dummy GOA unit.

8. The array substrate according to claim 1, wherein the at least one gate driving circuit includes two gate driving circuits; and the two gate driving circuits are located at outer sides of the two first sides and arc sides connected to the two first sides in the peripheral area.

9. A display panel, comprising the array substrate according to claim 1.

10. A display device, comprising the display panel according to claim 9.

11. The array substrate according to claim 1, wherein in the active GOA unit, at least part of transistors in the input sub-circuit and/or at least part of transistors in the pull-down sub-circuit are located in the second region of the active GOA unit, and remaining transistors in the active GOA unit are located in the first region of the active GOA unit;

in at least one dummy GOA unit, at least one of signal transmission paths coupled to at least one transistor that corresponds to the at least part of transistors in the input sub-circuit and/or the at least part of transistors in the pull-down sub-circuit and is located in the second region of the dummy GOA unit is disconnected.

12. The array substrate according to claim 11, wherein the second region of the dummy GOA unit is closer to the outer edge of the peripheral area than the first region of the dummy GOA unit.

13. The array substrate according to claim 1, wherein each of the at least one dummy GOA unit includes an input sub-circuit, a pull-down sub-circuit, a pull-up control sub-circuit, a pull-up sub-circuit, an output control sub-circuit, and an output sub-circuit.

* * * * *